(12) United States Patent
Hoerner et al.

(10) Patent No.: US 12,305,840 B2
(45) Date of Patent: May 20, 2025

(54) OPERATING ELEMENT AND METHOD FOR PRODUCING AN OPERATING ELEMENT

(71) Applicant: ams-OSRAM International GmbH, Regensburg (DE)

(72) Inventors: Patrick Hoerner, Regensburg (DE); Marc Philippens, Regensburg (DE); Erwin Lang, Regensburg (DE); Igor Stanke, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 0 days.

(21) Appl. No.: 18/287,845

(22) PCT Filed: Apr. 21, 2022

(86) PCT No.: PCT/EP2022/060612
§ 371 (c)(1),
(2) Date: Oct. 20, 2023

(87) PCT Pub. No.: WO2022/223726
PCT Pub. Date: Oct. 27, 2022

(65) Prior Publication Data
US 2024/0191868 A1    Jun. 13, 2024

(30) Foreign Application Priority Data

Apr. 22, 2021  (DE) ..................... 10 2021 110 363.0

(51) Int. Cl.
*F21V 23/04*  (2006.01)
*F21V 3/00*  (2015.01)
(Continued)

(52) U.S. Cl.
CPC ............ *F21V 23/0485* (2013.01); *F21V 3/00* (2013.01); *F21V 11/08* (2013.01); *H10H 20/857* (2025.01)

(58) Field of Classification Search
CPC ........ F21V 23/0485; F21V 3/00; F21V 11/08; H01L 33/62; H01L 33/50; H01L 25/167;
(Continued)

(56) References Cited

U.S. PATENT DOCUMENTS

2010/0259497 A1   10/2010   Livingston et al.
2019/0202290 A1   7/2019   Havemann

FOREIGN PATENT DOCUMENTS

DE   10 2010 062 428 A1   6/2012
DE   10 2011 050 585 A1   11/2012
(Continued)

OTHER PUBLICATIONS

International Search Report issued for corresponding International Patent Application No. PCT/EP2022/060612 on Jul. 26, 2022, along with an English translation (5 pages).
(Continued)

*Primary Examiner* — Elmito Breval
(74) *Attorney, Agent, or Firm* — Hauptman Ham, LLP

(57) ABSTRACT

A control element includes a carrier element, a luminous foil in which or on which at least two optoelectronic components for generating light along a first main radiation direction as well as contact lines connected thereto are arranged, a diffuser layer downstream of the at least two optoelectronic components with respect to the first main radiation direction, a structured symbol element which is not in front of the diffuser layer with respect to the first main radiation direction and designed to form at least one symbol when the at least two optoelectronic components are operated and in a top view of the diffuser layer when viewed along the first main radiation direction, and a tactile sensor adapted to detect contact or pressure exerted along or opposite to the first main radiation direction to generate an electrical signal.

25 Claims, 8 Drawing Sheets

(51) Int. Cl.
*F21V 11/08* (2006.01)
*H10H 20/857* (2025.01)

(58) Field of Classification Search
CPC ............. H01L 33/58; H01L 2933/0091; H01L 25/0753; G09F 2013/222; G09F 13/0427
See application file for complete search history.

(56) References Cited

FOREIGN PATENT DOCUMENTS

DE    10 2016 206 174 A1    10/2017
JP        2012-150304 A    8/2012

OTHER PUBLICATIONS

Written Opinion issued for corresponding International Patent Application No. PCT/EP2022/060612 on Jul. 26, 2022 (7 pages).

OPERATING ELEMENT AND METHOD FOR PRODUCING AN OPERATING ELEMENT

CROSS REFERENCE TO RELATED APPLICATION

This application is a National Stage of International Application No. PCT/EP2022/060612, filed on Apr. 21, 2022, which designates the United States and was published in Europe, and which claims priority to German Patent Application No. 10 2021 110 363.0, filed on Apr. 22, 2021, in the German Patent Office. All of the aforementioned applications are hereby incorporated by reference in their entireties.

The present application claims the priority of German patent application DE 10 2021 110 363.0 of Apr. 22, 2021, the disclosure content of which is hereby incorporated by reference in full.

The present invention relates to a control element and a control element panel. The invention further relates to a method of manufacturing such a control element.

BACKGROUND

Due to the increasing miniaturization of LED technology, many possibilities arise to realize display and control elements. Known forms use u-LED based displays for this purpose. In this case, µ-LEDs are opto-electronic components characterized by a very small edge length in the range of a few µm to about 100 µm. Besides the effort in manufacturing such displays, they are often very expensive because of the required active control (TFT backplane & control electronics). Furthermore, they are usually rectangular in shape and thus limited in terms of their possible applications.

Thus, there is a need to create control elements that can be used for a variety of different applications and yet can be manufactured at a lower cost than conventional techniques.

SUMMARY OF THE INVENTION

This need is met by the objects of the independent patent claims. Further embodiments and embodiments are the subject matter of the sub-claims.

The inventors have recognized that although display and control elements are used in many fields, they are usually simple and clearly arranged. By simply pressing a button, they can be switched on or off with their respective function, while at the same time a light element provides a visual indication of the respective status. Applications for such control elements can be found in the automotive sector, where vehicle functions, for example the interior lighting or similar, can be switched on or off simply by pressing a button. Illuminated controllers that can be used for control, which in turn are indicated by light signals, are also included. One example would be dimmers in the smart home sector or again in the automotive sector. Other such control elements can be found in automation and industrial technology, in aircraft construction and also in home appliances.

Since each pixel in a display is "equipped" with a uLED, a large proportion of the LED chips in a simple display element are not operated. However, the homogeneous illumination of the display symbol required by the application should still be ensured, whereby the number of LEDs should be as small as possible. Furthermore, it may be necessary, for example in the automotive sector or in aircraft construction, for the integration of the display and control element according to the invention to remain at least partially or predominantly transparent.

In order to meet the various requirements, the inventors propose the use of optoelectronic components within a flexible layer stack, whereby various symbol structures are used to represent and generate a display element. These can contain, for example, structured shadow masks or structured diffuser layers within the flexible layer stack. The further integration of a transparent capacitive or resistive haptic sensor (touch sensor) thus creates a control element in which not only the optoelectronic elements used are reduced, but in which the control is also significantly simplified.

In one embodiment according to the proposed principle, and control element comprises a carrier element and a luminous foil in which or on which at least two optoelectronic components and contact lines connected thereto are arranged. The at least two optoelectronic components generate light along a first main radiation direction during operation. A diffuser layer is arranged downstream of the at least two opto-electronic components with respect to the first main radiation direction. "Downstream" with respect to the first main radiation direction means hereinafter that one element follows another element when moving along the main radiation direction. Light emitted by the element along the main radiation direction thus hits the other element first.

Furthermore, a symbol element is provided which is not arranged in front of the diffuser layer with respect to the first main radiation direction. In other words, the symbol element is thus either arranged downstream of the diffuser layer with respect to the first main radiation direction or is formed in the diffuser layer itself. The symbol element is designed to depict at least one symbol when the at least two optoelectronic components are operated, and a top view of the diffuser layer is taken along the first main radiation direction or in the opposite direction thereto. In this context, a structured symbol element is to be understood as an element that represents one or more symbols for a user. A structured symbol element may comprise one or more letters, each letter forming a symbol of the structured symbol element. The structured symbol element may also comprise one or more characters, pictograms or icons, or a combination of such with letters.

Finally, according to the proposed principle, the control element comprises a touch-sensitive sensor configured to detect a touch or pressure exerted along or opposite to the first main radiation direction and to generate an electrical signal therefrom. In order to achieve the necessary homogeneous illumination of the control element and in particular of the structured symbol element, the distance between the diffuser layer and the at least two optoelectronic components depend on a distance between the at least two optoelectronic components.

The proposed control element provides a flexible solution that is equally suitable for a wide range of applications. The number of optoelectronic components is reduced and limited to the extent necessary for homogeneous illumination, and the control is significantly simplified. For this purpose, in some aspects, the optoelectronic components may be arranged in a matrix form, or may follow the shape of the symbol element, i.e., the optoelectronic components show an arrangement among themselves in plan view that is similar to the symbol to be illuminated. The control element is formed in a flexible structure, which allows it to be easily integrated into preexisting support surfaces, if necessary.

In some aspects, the structured symbol element is formed by a shadow mask arranged on the diffuser layer with respect to the first main radiation direction. This allows a wide variety of control elements to be created in a very simple manner by adjusting the shadow mask. In some aspects, in this regard, the distance between the diffuser layer and the at least two opto-electronic components may also be greater than half the distance between the at least two optoelectronic components. By this dependence between the distance of the opto-electronic components to the diffuser layer and the distance between two adjacent optoelectronic components (pixel pitch) the homogeneity of the illumination can be adjusted. The given dependence creates an overlap in the light cone and thus improves the illumination.

In another aspect, the structured symbol element is formed by the diffuser layer, including by a structuring in the diffuser layer, in particular by a spatial distribution of diffuser particles in the diffuser layer forming the structuring. Similar to the previous example, the distance between the diffuser layer and two adjacent optoelectronic components associated with the at least one symbol may be less than half the distance between the two adjacent optoelectronic components. In other words, the pixel pitch or the distance to the diffuser layer is chosen such that a sufficiently large overlap is created and thus the associated symbol is uniformly illuminated.

On the other hand, a symbol may contain several sub-symbols that are to be spaced apart from each other. It is therefore necessary that the sub-symbols can be well resolved. In the case of a patterned symbol element in the diffuser layer, the resolution results from the spacing between two adjacent opto-electronic components, one of which is associated with one sub-symbol and the other of which is associated with the other sub-symbol. Thus, in some aspects, a distance between the diffuser layer and two adjacent optoelectronic components associated with different symbols or sub-symbols is less than half the distance between the two adjacent optoelectronic components.

In some aspects, the necessary distance between the opto-electronic components and the diffuser layer is created by an adhesive layer that bonds the luminous foil to the diffuser layer. The thickness thereof substantially corresponds to the required distance between the diffuser layer and the at least two optoelectronic components.

In some aspects, a reflective or absorbent element is applied to a side facing away from the first main radiation direction to improve the luminous properties. In particular, this can be an absorbing color layer provided on the carrier element or the luminescent foil. An absorbing color layer prevents waveguiding of radiated light, which is totally reflected at the interface to the air and deflected back into the control element. In an alternative embodiment, in a side facing away from the first main radiation direction, the elements there can also be formed with absorber particles to prevent waveguiding of reflected light. It would be possible to provide these absorber particles in the support element, an adhesive layer between the support element and the luminous foil, or even in the luminous foil itself.

In some aspects, the diffuser layer can include an electrochromic layer. This may allow additional darkening of the symbol or adjustment of additional color shades. In addition to the aforementioned layers, additional layers may be provided to implement further functionalities for the control element. For example, in some aspects, an adhesive layer may be disposed between the support element and the luminous foil. The adhesive layer may be a hot melt adhesive having a thickness of only a few 10 µm. In addition, the control element can comprise a cover foil layer, which is arranged downstream of the diffuser layer with respect to the first main radiation direction. The cover film layer serves as a protection of the diffuser layer and may also adjust the refractive index to the broader medium to reduce total reflection.

Finally, in some aspects, the control element may include an optionally partially transparent colored layer that is patterned with respect to the first main radiation direction of the diffuser layer. The color layer may optionally be structured and, in particular, structured similarly to the structured symbol element. The additional color layer improves the impression of the symbol. Additionally, further color impressions may be created to provide additional information to a user.

In some aspects, converter layers may be provided to convert light generated by the optoelectronic components of a first wavelength to a second wavelength. In some aspects, these layers are downstream of the diffuser layer, i.e., the emitted light is first homogenized by the diffuser layer and then converted to a second wavelength. In some other aspects, the diffuser layer of the control element comprises converter particles for converting radiated light of a first wavelength into light of a second wavelength.

In some further aspects, it may be desirable to further manipulate the light emitted from the optoelectronic components. To this end, in some aspects, a color filter may be provided that is positioned downstream of the diffuser layer with respect to the main radiation direction, wherein the color filter is particularly unstructured. The color filter can be used, for example, to narrow a broader emission spectrum so that a particular color can be selected from a plurality of possible ones. In some aspects, the color filter is adjustable.

In addition to these elements for manipulating emitted light, some embodiments relate to a control element in which the at least two optoelectronic components are configured to generate light of different wavelengths. For this purpose, components are used that generate different colors, so that not only mixed colors can be generated, but also the control element can shine in different colors depending on the control, e.g. red or green. In this respect, components of different colors can be arranged close to each other on or in the luminescent foil, so that the requirements for homogeneity and also resolution remain guaranteed as mentioned above. Several luminescent foils with components of different colors can also be arranged on top of each other to create the desired effect.

For improved stabilization, in some embodiments the control element comprises a glass layer as a support element. Alternatively, the carrier element can also have a carrier film applied to a glass layer. A glass layer is understood here as any rigid transparent layer. This may comprise SiO2 but also a rigid and transparent plastic such as Plexiglas or the like.

In some embodiments, support elements are provided whose thickness is in the range of a few 10 µm to about 200 µm. Such support layers, possibly formed with SiO2 or other glasses or transparent plastics, are designed to be flexible and bendable. In some aspects, such thin glass layers are provided whose thickness is between 50 µm to 200 µm but still have barrier effect of thick glass.

Some other aspects relate to the design and position of the touch-sensitive sensor. In some aspects, the touch-sensitive sensor is positioned between the luminous foil and the diffuser layer. Alternatively, the touch-sensitive sensor may be arranged downstream of the diffuser layer with respect to the first main radiation direction. In a further alternative embodiment, the touch-sensitive sensor is arranged between the carrier element and the luminescent foil. The tactile sensor may be a capacitive or resistive sensor. In some aspects, the extension may correspond to at least one extension of the structured symbol element. Thus, it is possible for the extent of the sensor to correspond to the size of the control element, but the sensor may also be smaller.

Some further aspects concern the optoelectronic components. For example, the at least two optoelectronic components may be designed as horizontal light-emitting diodes, each with two contact pads on the same side. The contact pads are connected to terminals of the contact lines. This is expedient, since in this way the radiation side is free of contact pads or other shading. If necessary, light is emitted away from the luminescent foil on which the components are arranged. However, another solution is also conceivable in which the components shine through the luminescent foil, they would thus be arranged on the "underside" of the foil. Alternatively, the at least two optoelectronic components may also be designed as vertical light-emitting diodes, wherein one of the contact lines is guided along an insulated side of each of the opto-electronic components onto a contact pad located on a light emission side of the optoelectronic component. In another aspect, the two optoelectronic components are surrounded by a transparent material in the main radiation direction. The material may be air or other gas, whereby in such a case the opto-electronic components are embedded in a cavity. The surrounding material has a refractive index lower than a material of the diffuser layer or an adhesive layer covering the transparent material. This improves the radiation characteristics. With a suitable choice of materials, light shaping or guiding can also be performed so that the light emitted from the opto-electronic devices along the first main emission direction is guided onto the symbol structure.

Another aspect relates to the possibility of configuring the control element such that it can illuminate in multiple directions and optionally also be operated. Such an element can be used, for example, for windows, glass doors, or the like. Thus, in some aspects, the control element comprises a second main radiation direction oriented substantially opposite to the first main radiation direction. In addition, the control element comprises a second diffuser layer that is disposed downstream of the at least two optoelectronic components with respect to the second main radiation direction. In other words, the two optoelectronic components are thus arranged between two diffuser layers in the control element proposed for these aspects. Furthermore, the control element comprises a structured second symbol element which is not arranged in front of the second diffuser layer with respect to the second main radiation direction and which is designed to display at least one symbol during operation of the at least two opto-electronic components and a top view of the second diffuser layer along the main radiation direction.

This aspect thus creates a control element that is illuminated on both sides and can be used. It may be useful to arrange the at least two optoelectronic components possibly on different sides of the luminous foil. In this way, both sides can be illuminated separately if the luminous foil is reflective or absorbent.

In a further aspect, the structured second symbol element is formed by a second shadow mask arranged after or on the second diffuser layer with respect to the second main radiation direction. The distance between the second diffuser layer and the at least two optoelectronic components is greater than half the distance between the at least two optoelectronic components. Alternatively, the structured second symbol element may also be formed by the diffuser layer. In such an embodiment, it is thus possible to provide different types of symbols so that the control element shows different symbols depending on the viewing direction.

In a further aspect, the control element comprises a second touch-sensitive sensor configured to detect a touch or pressure applied along the second main radiation direction and to generate an electrical signal therefrom. With a second touch-sensitive sensor, the user element can be operable from both sides. For this purpose, in some aspects, it may be provided that the first and/or second touch-sensitive sensor is arranged between two carrier elements and subsequent with respect to the main radiation direction of the respective diffuser layer. The second sensor can also be a capacitive sensor, whereby the strength of a signal change can be used to distinguish which of the two sensors is to respond. This allows the control element to be used on both sides and still distinguish which sensor has been activated by touching or feeling the control element.

Another aspect relates to the design of the control element to facilitate operation and, if necessary, to provide haptic feedback to the user. In some aspects, the control element comprises a haptic button element that is downstream of the respective diffuser layer with respect to the first and/or second main radiation direction. The haptic button element is used to guide the user to the control element. For this purpose, the haptic button element may have a curvature on its surface.

In some aspects, the haptic touch element is applied to a carrier foil or a glass layer which is arranged downstream of the respective diffuser layer with respect to the first and/or second main radiation direction.

Another aspect is created with a control element panel, in particular for a vehicle, an aircraft, or an automation or industrial application. The control element panel comprises a glass element, in particular a pane or panel, and the control element according to the proposed principle. According to the invention, the control element is arranged on the glass element in such a way that the glass element forms the support element of the control element, or the support element is intimately connected to the glass element. The control element thus becomes part of the pane or glass element. This enables the provision of several control elements on panes, glass surfaces or generally smooth surfaces. Particularly in the case of glass surfaces, the transparency can be retained to a large extent, resulting in only insignificant shading while at the same time improving functionality.

A further aspect concerns a process for manufacturing a control element. In such a process, a carrier element and a luminescent foil are provided. At least two optoelectronic components and contact lines connected thereto are arranged in or on the luminous foil. The at least two optoelectronic components in one operation are designed to generate light along a first main radiation direction. According to the proposed principle, a luminous foil is arranged on the carrier element. Likewise, a diffuser layer is applied to the luminescent foil so that light emitted by the at least two optoelectronic components in one operation along the first main radiation direction radiates through the diffuser layer. A distance between the diffuser layer and the at least two optoelectronic components is set so that it depends on a distance between the at least two optoelectronic components. A structured symbol element is provided and arranged not in front of the diffuser layer with respect to the first main radiation direction. The structured symbol element is configured to image at least one symbol during operation of the at least two opto-electronic components and a top view of the diffuser layer along the first main radiation direction.

Finally, the method according to the proposed principle comprises arranging a touch-sensitive sensor adapted to detect a touch or pressure exerted along or opposite to the first main radiation direction and to generate an electrical signal therefrom.

The method produces a control element that is flexible due to the films used, and thus can be used for a variety of applications. In some aspects, the diffuser layer is applied to and attached to the luminous foil using an adhesive layer. The thickness of the adhesive layer is selected such that the distance between the diffuser layer and two adjacent optoelectronic components associated with the symbol is greater than half the distance between the at least two optoelectronic components. On the other hand, the distance between the diffuser layer and two adjacent optoelectronic components assigned to different symbols is less than half the distance between the two adjacent optoelectronic components.

The structured symbol element can be formed by a shadow mask arranged on the diffuser layer with respect to the first main radiation direction. Alternatively, the structured symbol element may be formed by the diffuser layer itself. In some further aspects, it is proposed to provide a reflective or absorbing element on a side opposite to the first main radiation direction. In particular, this may be an absorbing ink layer on the carrier element or the luminous foil. Alternatively, the carrier element or the luminous foil can also be formed with absorber particles on the side facing away from the first main radiation direction. This avoids waveguiding of emitted light in the control element or along the boundary layers towards an external medium.

The luminescent foil can be bonded to the carrier element by an adhesive layer. It is also possible to provide a cover film layer for protection against damage or adjustment of the refractive index. The cover film layer is positioned downstream of the diffuser layer with respect to the main radiation direction. An optionally partially transparent color layer can also be applied, which is arranged downstream of the diffuser layer with respect to the main radiation direction, the color layer optionally being structured and, in particular, structured in a manner similar to the structured symbol element. By all these measures, a visual impression on a user can be improved.

In some aspects, the tactile sensor may be disposed between the luminous foil and the diffuser layer. Similarly, it is possible to arrange the touch-sensitive sensor downstream of the diffuser layer with respect to the first main radiation direction. In an alternative embodiment, the touch-sensitive sensor is arranged between the carrier element and the luminescent foil.

Another aspect is the possibility to emit light in two opposite directions and thus to create a control element that is visible and operable from two sides. For this purpose, the method in some aspects provides that one of the at least two optoelectronic components is configured to emit light in a second main emission direction, which is oriented substantially opposite to the first main emission direction. The method now further comprises arranging a second diffuser layer which is arranged downstream of the at least two opto-electronic components with respect to the second main radiation direction. Furthermore, a structured second symbol element is formed which is not arranged in front of the second diffuser layer with respect to the second main radiation direction. This serves to display at least one symbol when at least one of the at least two optoelectronic components is operated and a top view of the second diffuser layer is taken along the main radiation direction.

In some aspects, the patterned second symbol element is formed by a second shadow mask disposed on the second diffuser layer with respect to the second main radiation direction. The distance between the second diffuser layer and the at least two optoelectronic components is greater than half the distance between the at least two optoelectronic components. In addition, the structured second symbol element can be formed by the diffuser layer, in particular by a spatially inhomogeneous distribution of diffuser particles.

In some aspects, to generate a dual-sided usable control element, a second touch-sensitive sensor may be arranged and configured to detect a touch or pressure applied along the second main radiating direction and to generate an electrical signal therefrom;

The first and/or second tactile sensor may be arranged between two support elements and subsequent with respect to the main radiation direction of the respective diffuser layer. Likewise, a haptic sensing element may be arranged to be downstream with respect to the first and/or second main radiation direction of the respective diffuser layer.

BRIEF DESCRIPTION OF THE DRAWING

Further aspects and embodiments according to the proposed principle will be revealed with reference to the various embodiments and examples described in detail in connection with the accompanying drawings.

DETAILED DESCRIPTION

Figure 1:
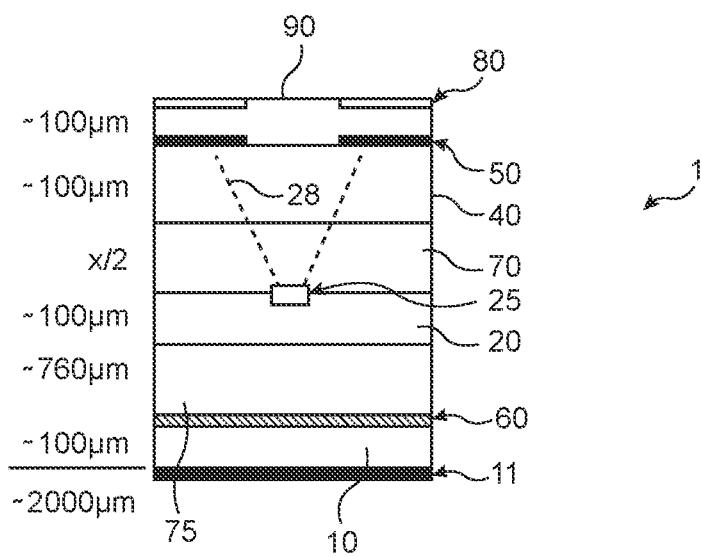
FIG. 1 shows a first embodiment of a control element having some aspects according to the proposed principle.

The following embodiments and examples illustrate various aspects and combinations thereof according to the proposed principle. The embodiments and examples are not always to scale. Likewise, various elements may be shown enlarged or reduced in size to emphasize individual aspects. It goes without saying that the individual aspects and features of the embodiments and examples shown in the figures can be readily combined with each other without affecting the principle of the invention. Some aspects have a regular structure or shape. It should be noted that minor deviations from the ideal shape may occur in practice, but without contradicting the inventive idea.

Furthermore, the individual figures, features and aspects are not necessarily shown in the correct size, nor do the proportions between the individual elements have to be fundamentally correct. Some aspects and features are emphasized by making them larger. However, terms such as "top", "above", "below", "larger", "smaller" and the like are correctly represented in relation to the elements in the figures. Thus, it is possible to derive such relationships between the elements based on the figures. However, the proposed principle is not limited to this, but different opto-electronic components, with different size and also functionality can be used in the invention. In the embodiments, elements with the same or similar functions are indicated by the same reference signs.

In many applications today, there is a requirement to provide display and control elements on transparent surfaces. The main aim here is to make optimum use of the available space without obstructing the user's view through the transparent surface of a windshield, for example. Roof consoles in the automotive sector are a typical example of display and control elements in the area of such transparent surfaces. In aircraft construction, automation and industrial technology, as well as in various home appliances or consumer electronics, it is also useful to arrange display and control elements on transparent surfaces. However, the current design of such display and control elements leads to an impairment of the field of view, since mainly non-transparent components are used. In addition, the design options are also limited, since the display and control elements usually follow fixed shapes.

The inventors have set themselves the goal of realizing lowcost and partially transparent and filigree display elements so that they can also be used on transparent surfaces without the disadvantages listed above. At the same time, the disadvantages that occur with so-called transparent displays are to be avoided. These are among other things the complex control by means of a TFT pipeline or control electronics as well as often the optoelectronic components, which are superfluous depending upon display and control elements and thus not needed. Nevertheless, due to the various application possibilities mentioned above, it is necessary to keep the control element flexible so that it can be applied not only to smooth and straight transparent surfaces, but also, for example, to curved surfaces.

The inventors therefore propose, among other things, an embodiment of an optical display and control element according to FIG. 1. This contains, by way of example, some aspects of the proposed principle, which are explained in more detail in the further embodiments and, moreover, can be combined in various ways. In this way, the requirements in the respective field of application can be taken into account.

The embodiment of FIG. 1 comprises a carrier film 10 which is flexible and made, for example, of a plastic such as PET, PP, PE or another material. The plastic can be transparent. In the present example, a touch-sensitive sensor 60 is applied to the carrier foil 10. The sensor 60 extends over the entire lateral extent of the optical display and control element and comprises a capacitively responsive sensor element together with its supply and control lines. The touch-sensitive sensor 60 may be significantly thinner than the carrier film as shown, such that stability is substantially achieved by carrier film 10. An adhesive layer 75 is now applied to the touch-sensitive sensor, bonding the touch-sensitive sensor on the carrier film 10 to a luminous foil 20. The luminous foil comprises one or more opto-electronic components 25 together with their control and supply lines. The control and supply lines are omitted here for clarity.

In the present embodiment, the opto-electronic components 25 are arranged on the surface of the luminous foil 20 and, in particular, on the side of the luminous foil 20 facing away from the adhesive layer 75. In an alternative embodiment, these optoelectronic components can also be provided in the luminous foil 20, so that the luminous foil 20, surrounds the optoelectronic components 25. For this purpose, it is conceivable to produce the luminous foil 20 separately and, for example, to build it up from several partial layers. These are arranged on top of each other so that the optoelectronic components 25 are arranged between different partial layers of the luminous foil 20.

The optoelectronic components 25 in or on the light-emitting sheet 20 have a main radiation direction 28. The main radiation direction is defined by the direction of the light emitted by the optoelectronic components during operation. The luminous foil 20 is bonded to a diffuser layer 40 by means of an adhesive layer 70. Diffuser layer 40 contains diffuser particles which scatter the light emitted by the opto-electronic components 25 and thus distribute it homogeneously. On the diffuser layer 40, in the present embodiment example, a structured mask 50 is applied as a symbol element, over which in turn a protective foil 90 is arranged. Optionally, a further structured ink layer 80 can be arranged on the protective film 90.

PET or another transparent plastic described in this application is used as the material for the individual film layers. As material for the adhesive layer, PVB or also EVA can be used, in addition to other adhesives.

During operation of the present control element, the opto-electronic components 25 generate light and emit it along the main emission direction 28 in the direction of the diffuser layer 40. In the diffuser layer 40, the emitted light is distributed as uniformly as possible and then falls on the shadow mask 50 so that a user can recognize one or more symbols when looking in the direction of the optoelectronic components. The mask 50 comprises an absorbing color layer so that the light outside the recessed area is absorbed.

The different materials may also cause total reflection within the layer sequence, so that the light is reflected back and emitted away, in particular towards the carrier film 10. In order to prevent wave conduction of the light reflected in this manner within the control element, an absorbent ink layer 11 is applied to the rear surface of the carrier foil 10.

Figure 2A:
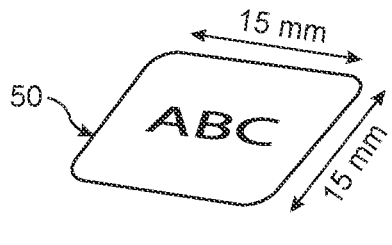
FIGS. 2A and 2B show various aspects of the proposed principle, in this case illustrating a shadow mask and the spacing relationship between optoelectronic components and diffuser layer.
Figure 2A:
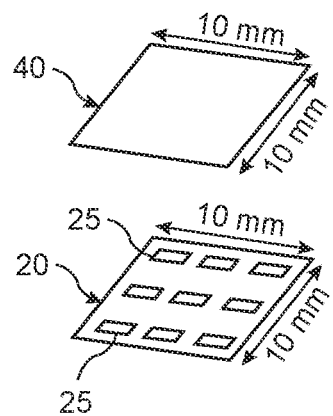
Figure 2B:
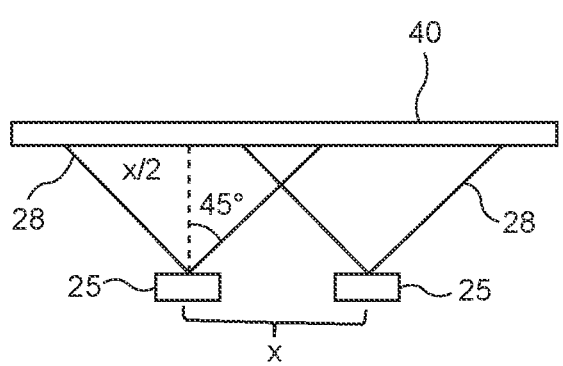

FIGS. 2A and 2B show some further aspects of the proposed principle, in particular to explain the corresponding dimensioning. In the present FIG. 2A, it is shown that the display and control element has approximately a dimension of 15×15 mm. The mask 50 therefore comprises approximately the same dimension and, as shown here, shows a string ABC formed by recesses in the shadow mask. The diffuser layer 40, on the other hand, is made somewhat smaller and is arranged centrally below the shadow mask 50. In particular, the diffuser layer 40 thus lies above the exposed surfaces of the shadow mask and the symbols A, B and C shown.

For the most homogeneous illumination possible, a pixel matrix of 3×3 optoelectronic components 25 is now provided as part of the luminescent foil 20. In one operation, this pixel matrix generates light of a predetermined wavelength, which falls homogeneously through the diffuser layer 40 and from below onto the shadow mask. Thus, a user sees a uniformly illuminated symbol sequence ABC. In this example, components 25 of the same color are used. However, to create different colors, it is also possible to use components of different colors. These can, for example, illuminate different symbols.

FIG. 2B shows some aspects of a dimensioning of the display and control element according to the proposed principle. Shown are two adjacent optoelectronic components, which have a distance to each other, which is also called pixel pitch. In order to achieve homogeneous illumination of the symbols A, B and C in the shadow mask 50, it is advantageous that the light emitted by the optoelectronic components overlaps before it falls on the diffuser layer 40.

Otherwise, there is a risk that there will not be sufficient light distribution and homogenization in the diffuser layer 40 either, so that a user perceives a different light distribution and possibly even the individual electronic components 25 when looking at the display and control element from above across the symbols. In order to prevent this, it is expedient that the spacing of the optoelectronic components 25, at a predetermined aperture angle of, for example, 45°, has a certain dependence on the pixel pitch.

As shown in FIG. 2B, the two light cones emitted by the optoelectronic components overlap along the main emission direction 28 when the distance between the optoelectronic components 25 and the diffuser layer is approximately half of the pixel pitch x. If the distance of the optoelectronic components 25 to the diffuser layer 40 is larger, the overlap of the respective light cones along the main radiation direction 28 also increases and the homogenization by the diffuser layer 40 is improved.

In order to achieve the necessary distance between the opto-electronic components 25 and the diffuser layer 40, it is proposed to design the thickness of the adhesive layer 70 accordingly. The distance between the optoelectronic components on the surface of the luminous foil 20 is thus essentially determined by the thickness of the adhesive layer 70. If the thickness of the diffuser layer 40 is greater, an overlap can also be made within the diffuser layer so that homogenization is thereby ensured.

Figure 3A:
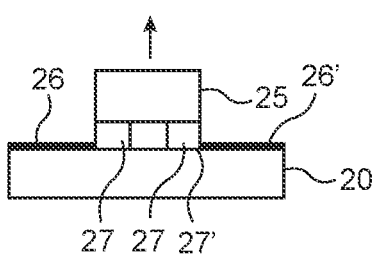
FIGS. 3A, 3B and 3C illustrate various embodiments of optoelectronic components arranged on a layer for generating the luminous foil according to some aspects of the proposed principle.
Figure 3B:
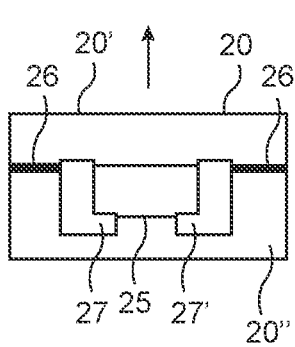

Several embodiments and designs are conceivable for manufacturing electronic components on the luminous foil 20. FIGS. 3A and 3B show various possible designs for the arrangement of optoelectronic components 25 on or in the luminous foil.

Partial FIG. 3A shows the arrangement of an optoelectronic component 25 as a horizontal light-emitting diode on the light-emitting foil. The luminescent foil 20 includes a plurality of leads 26 and 26' leading to contact pads and terminals 27 and 27', respectively. The optoelectronic component 25 is designed as a horizontal light-emitting diode, so that the two contact pads 27, 27' are arranged on a side of the opto-electronic component 25 opposite the main radiation direction. The optoelectronic component 25 is arranged with its two contacts 27 and 27' on the terminals of the light-emitting foil and is intimately connected to these by means of solder or other processes. In this embodiment, the optoelectronic component 25 lies directly on the luminous foil 20 and can be surrounded by a transparent material, for example the adhesive layer 70.

FIG. 3B shows an embodiment in which the optoelectronic component 25 is integrated into the luminous foil. For this purpose, the luminescent foil 20 comprises a first sub-layer 20' on which the leads 26 and 26' are arranged on one side. The optoelectronic component is now applied to the sublayer 20' with its light-emitting side. The leads 26 and 26' are guided to the underside of the optoelectronic component 25 by means of a solder or other metallic contact. As shown in FIG. 3B, the two contact leads at least partially surround the component on at least two sides and contact the connection pads 27 and 27' on the side of the optoelectronic component opposite the sublayer 20'. A second sublayer 20" is then applied, which encapsulates and completely surrounds the optoelectronic component. The two sublayers 20' and 20" thus completely embed the optoelectronic component 25 in the luminous foil 20.

Figure 3C:
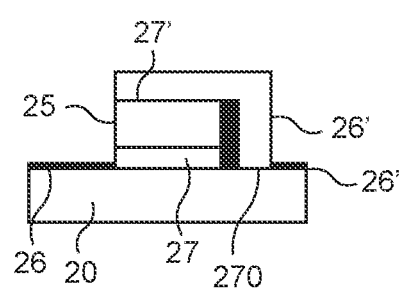

In contrast, partial FIG. 3C shows an embodiment with an opto-electronic component as a vertical light-emitting diode. In vertical light emitting diodes, in contrast to horizontal light emitting diodes as in partial FIGS. 3A and 3B, the contact pads 27 and 27' are arranged on opposite sides and surfaces of the component 25. In FIG. 3C, the opto-electronic component 25 has its contact pad 27 guided to and connected to a terminal. Contact pad 27 thus makes contact with the leads 26 on the light-emitting foil 20. A further lead 26' is guided via an externally arranged feed to the upper side and thus the light-emitting side of the optoelectronic component 25 and connected to contact pad 27'. In order to avoid shading and thus a reduction in the intensity of the emitted light, the feed 26' on the upper side of the optoelectronic component is transparent. For example, ITO or other suitable materials can be used for this purpose. To prevent a short circuit, an insulation 270 is also arranged on the side wall along which the feed runs. This prevents a short circuit between the feed line 26 and, for example, the further contact pad 27 or the individual semiconductor layers of the optoelectronic component.

Figure 4:
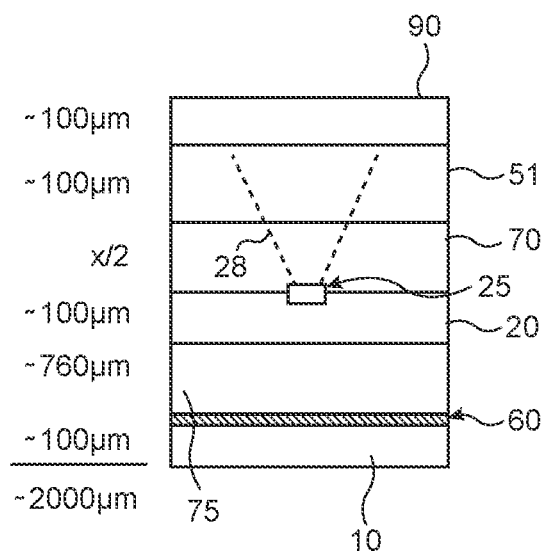
FIG. 4 shows a second embodiment of a control element with some aspects according to the proposed principle.

In addition to the use of a mask, it is also possible to structure the diffuser layer, which is illuminated by the light of the component, in a suitable manner to produce the desired symbol element. FIG. 4 shows a corresponding embodiment to explain this principle. Structures with the same function or effect bear the same reference signs.

The display and control element of FIG. 4 again comprises a flexible carrier foil 10 with a touch-sensitive sensor 60 arranged thereon, which is attached to the luminous foil 20 by means of an adhesive layer 75. A plurality of optoelectronic components 25 with their respective leads are arranged in or on the luminous foil 20. For the sake of simplicity, only one optoelectronic component is shown here with the associated emission direction 28. The luminous foil 20 is bonded to the structured diffuser layer 51 via a further adhesive layer 70. A cover layer 90 is applied to the structured diffuser layer 51.

The diffuser layer is structured by a spatially inhomogeneous distribution of diffuser particles within the diffuser layer. Alternatively, absorber particles can also be arranged in the diffuser layer, which are again inhomogeneously distributed, so that the desired symbol results as negative for a user by absorbing light. The symbols would shine here, the absorber particles absorb light outside the symbols. The further cover layer 80 serves to adapt the different refractive indices to the surrounding medium and in particular to air, so that a total reflection back into the different layers of the display and control element is avoided or reduced.

Figure 5A:
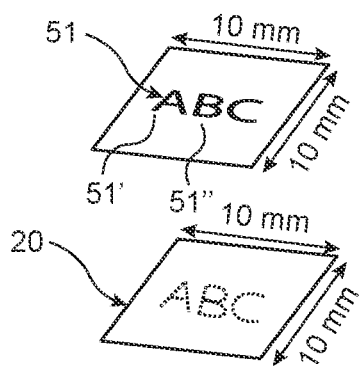
FIGS. 5A and 5B illustrate various aspects of the proposed principle, in this case the illustration of a shadow mask and the spacing relationship between optoelectronic components and diffuser layer.
Figure 5B:
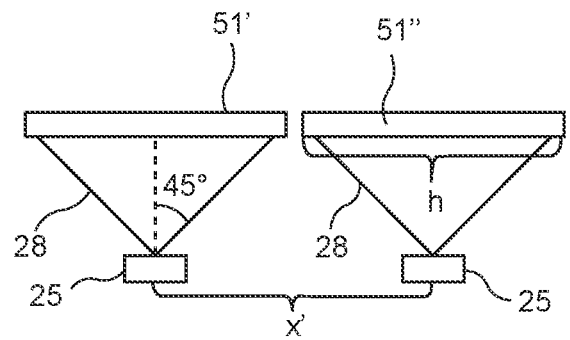

FIGS. 5A and 5B show aspects of the optical display and control element on the transparent surface to explain the principle. As shown, the symbols are also generated here in the form of a character string ABC by the structured diffuser 51. On the one hand, the aim is to achieve the best possible homogenization of each individual symbol A, B and C. On the other hand, it should also be ensured that the symbols are not mixed. On the other hand, it should also be ensured that a user can separate the different symbols from each other, i.e., for example A and B. Accordingly, the spacing of the optoelectronic components must be chosen in a suitable manner.

As shown in FIG. 5A, the light-emitting foil 20 comprises a number of individual optoelectronic components, each of which in turn roughly reproduces the individual symbols. This aspect alone creates advantages, because in contrast to a normal matrix in rows and columns, the optoelectronic components already approximately reproduce the symbols to be displayed later.

Neighboring components, which are thus assigned to the same symbol, for example symbol A, should therefore be spaced apart so that the light distribution is as homogeneous as possible. For example, the distance between the components and the diffuser layer can be selected by the pixel pitch x, as already explained in FIG. 2B. Such a distance allows an overlap of light from the optoelectronic components assigned to the same symbol and thus creates a homogeneous light distribution for this symbol.

FIG. 5B shows the second case where two adjacent opto-electronic components 25 are assigned to different symbols, e.g. symbols A and B. In such a case, the distance between the two optoelectronic components 25 is the same. In such a case, the distance between the two opto-electronic components x' must be selected in such a way that there is precisely no overlap, since otherwise a user may no longer be able to resolve or distinguish between the two symbols in the structured diffuser layer 51. In other words, the pixel pitch x' between the two adjacent opto-electronic components 25, which are assigned to different symbols, is larger than approximately half of the area 51' or 51" of the respective symbol to be illuminated. In other words, the distance between the structured diffuser layer 51' or 51" and the optoelectronic components is smaller than half the pixel pitch x' of the two adjacent opto-electronic components 25.

In this way, flexible display and control elements can be created in which the respective symbols are generated either by a suitable shadow mask or by an inhomogeneous distribution of diffuser or absorber particles within a diffuser layer. The additional covering layer 90 serves on the one hand to protect the underlying diffuser layer 51 or the shadow mask 50 and can also assume the functionality of adapting the refractive index to the surrounding medium. This reduces the likelihood of total reflection of radiated light back into the display and control element. The thickness dimensions shown in FIGS. 1 and 4 are to be understood as examples and may vary depending on the application. In particular, the adhesive layer 75 can also be thinner and thus further reduce the thickness of the entire component. This makes it possible to arrange components between different glass layers and thus to integrate them into a pane or the like.

Figure 6:
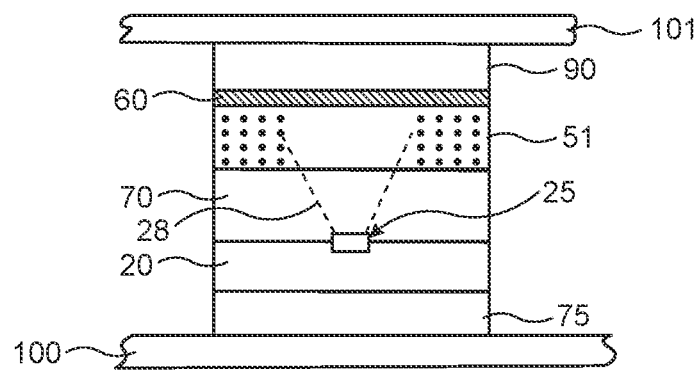
FIG. 6 shows a third embodiment of a control element with some aspects according to the proposed principle.

FIG. 6 shows such an embodiment. Here, a first glass layer 100 simultaneously forms the carrier element 10 for the optical display and control element. An adhesive layer 75 is applied to the glass layer 100 to bond the glass layer to the luminous foil 20. Several components 25 are integrated in the luminous foil 20 and generate light along the main radiation direction 28 during operation. This light is coupled into a structured diffuser layer 51 via a hot-melt adhesive layer 70 and generates one or more symbols there when a user looks down on the optical display element.

The structured diffuser layer 51 is designed here with absorber particles which absorb the light emitted by the opto-electronic components 25. The absorber particles in the diffuser layer 51 thus form a negative for the symbols to be displayed. Above the structured diffuser layer 51, a transparent touch-sensitive sensor element 60 is arranged, which is protected by a cover layer 90. On top of the cover layer 90, again a glass pane 101 is applied and intimately connected to it.

In the embodiment of FIG. 6, several changes have been made with respect to the preceding embodiments, each of which can also be combined with the other embodiment examples. Firstly, this relates to the arrangement of the touch-sensitive sensor element 60 within the optical display and control element. Whereas, in contrast to the previous embodiments, the touch-sensitive sensor element 60 is arranged outside the main beam direction, in the embodiment of FIG. 6 it is located above the structured diffuser layer 51. It is thus arranged in the main beam direction of the light and, in particular, downstream of the diffuser layer 51 with respect to the main beam direction. A user touching the glass layer 101 in the region above the structured diffuser layer can thus be detected by the sensor 60 and a signal generated therefrom. A second aspect relates to the arrangement of absorber particles in the structured diffuser layer 51, which acts as a negative and is similar to the shadow mask. The spatial distribution of the absorber particles is inhomogeneous, so that different symbols can be realized. Finally, the support element is here directly designed as a glass layer 100, so that the overall thickness of the optical display and control element is reduced.

Figure 7:
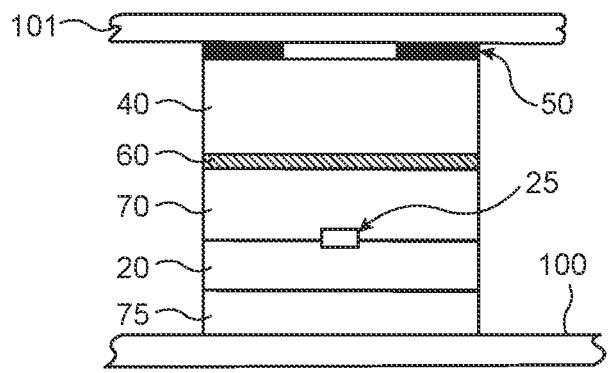
FIG. 7 shows a fourth embodiment of a control element having some aspects according to the proposed principle.

FIG. 7 shows a further embodiment similar to the embodiment in FIG. 6. In contrast to the structured diffuser layer 51 used in the embodiment of FIG. 6, a shadow mask 50 is applied directly to the diffuser layer 40, which is unstructured per se. The shadow mask is covered by a glass layer 101 which protects the shadow mask 50 and the underlying diffuser structure 40. In contrast to FIG. 6, the touch-sensitive sensor is arranged between the adhesive layer 70 and the diffuser layer 40. The control element shown in FIG. 7 is thus inserted and fixed between the two glass layers 100 and 101.

In the area of pane or glass panels, the display and control element can thus be arranged between the two individual panes according to the proposed principle. In this respect, the display and control element can be used as part of a connecting structure between the two individual panes to form a complete windshield or panoramic pane. The display and control element according to the proposed principle can always be provided in the interconnecting layer in the case of assembled panes.

Figures 8A, 8B:
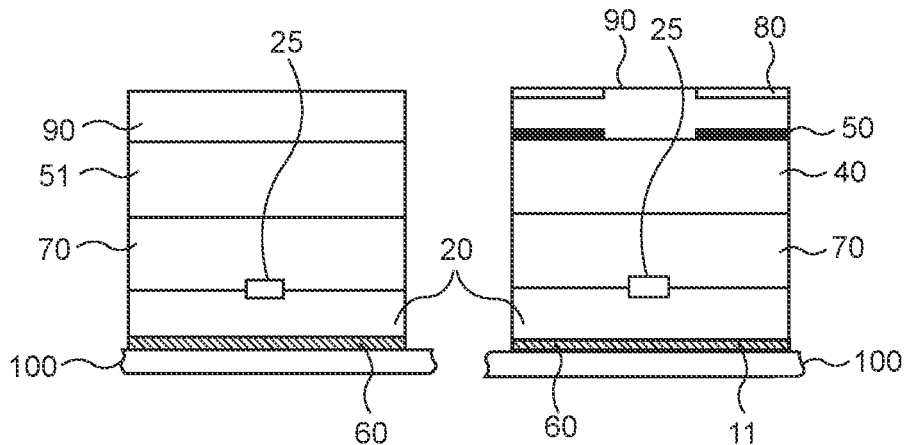
FIGS. 8A and 8B illustrate a fifth and sixth embodiment of a control element with some aspects according to the proposed principle.

FIGS. 8A and 8B show further aspects of the proposed principle. In FIG. 8A, the touch-sensitive sensor 60 is provided directly on the glass pane 100 as a supporting element, and then the luminous foil 20 is provided directly thereon. An adhesive layer 70 is applied between the luminous foil 20 and the optoelectronic components 25 located thereon, which bonds the luminous foil 20 to the structured diffuser layer 51. The cover film layer 90 is glued to the diffuser layer 51. FIG. 8B shows a similar embodiment. In contrast to FIG. 8A, an absorbent ink layer 11 is applied to the carrier element 100. The touch-sensitive sensor 60 is again arranged on this layer.

Instead of the structured diffuser layer 51 of FIG. 8A, a diffuser layer 40 made of a non-structured material is used in partial FIG. 8B. To generate symbols, the shadow mask 50 is arranged on the diffuser layer 40, which in turn is followed by a cover film layer 90 and, thereon, a structured color layer 80.

Figures 9A, 9B:
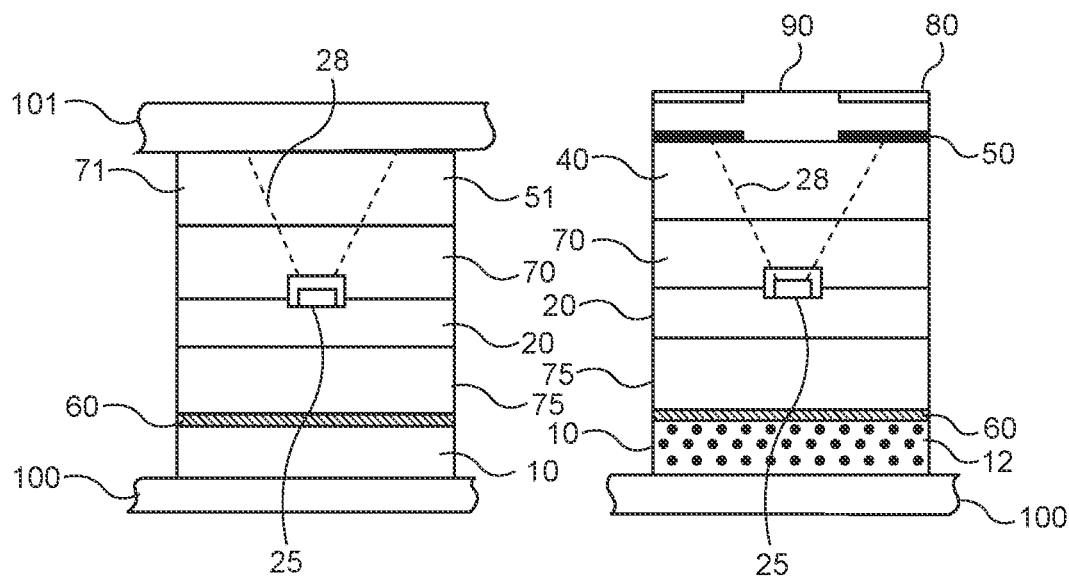
FIGS. 9A and 9B illustrate seventh and eighth embodiments of a control element for explaining some aspects of the proposed principle.

FIGS. 9A and 9B disclose further combinable aspects of the proposed principle. In FIG. 9A, a display and control element are shown which is sandwiched between two glass sheets 100 and 101. The display and control element comprises a flexible carrier foil 10 with a touch-sensitive sensor 60 applied thereto, an adhesive layer 75 and a luminescent foil 20 arranged thereon and connected thereto. One or more optoelectronic components 25 are in turn arranged on the luminescent foil 20. As shown, the components are surrounded only by a further medium 71 which has a lower refractive index than the adhesive layer 70.

The shape of the further medium or material 71 can be designed to run out in the edge region of the optoelectronic components, whereby the medium 71 also runs parallel in particular along or parallel to the light-emitting surface of the opto-electronic components. In some embodiments, the component can thus be arranged in a recess or recess in the layer 70. In embodiments where the devices 25 are implemented within the luminous foil, they may be disposed within a recess in the luminous foil 20.

For example, it is possible to implement the luminescent foil with multiple layers as in one of the previous examples, wherein the optoelectronic components are each arranged in a recess within one of these sub-layers. Each component may be arranged in a separate recess, or several components may be arranged in a common recess. The recess is larger than the opto-electronic component (s) themselves, so that there is a space between the light-emitting surface and a subsequent material layer. This intermediate space is filled with gas, which has a lower refractive index than the surrounding material. The surrounding medium with the low refractive index reduces total reflection of emitted light and at the same time improves guidance along the desired main radiation direction into the adhesive layer 70 or layers above it.

The adhesive layer 70 further bonds the luminous foil 20 to the patterned diffuser layer 51 to produce one or more symbols.

In contrast, FIG. 9B shows a slightly different embodiment, in which the corresponding symbols are conveyed to a user not by structuring the diffuser layer 51, but by means of a shadow mask 50 applied to the unstructured diffuser layer 40. A cover film layer 90 with a color layer 80 incorporated therein is again formed over the shadow mask 50. Absorber particles 12 are further incorporated into the carrier film layer 10 to prevent a waveguide function due to total reflection. Depending on the design, the absorber particles can also be incorporated in the foil layer 20 below, i.e. against the main radiation direction of the optoelectronic components 50. It is also possible to provide the absorber particles in the adhesive layer 75. In this respect, it should be mentioned that for a change or reduction of light waveguiding within the display and control element, both an absorbing color layer and absorber particles can be incorporated at different locations on the side of the display and control element opposite to the main radiation direction 28. Thus, various embodiments and designs of such a color layer or of absorber particles are conceivable.

Figure 10A:
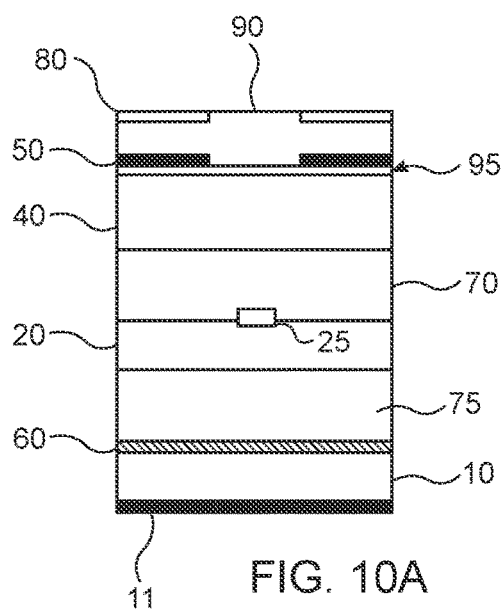
FIGS. 10A and 10B are illustrations of a ninth and 10th embodiment of a control element with some aspects according to the proposed principle.
Figure 10B:
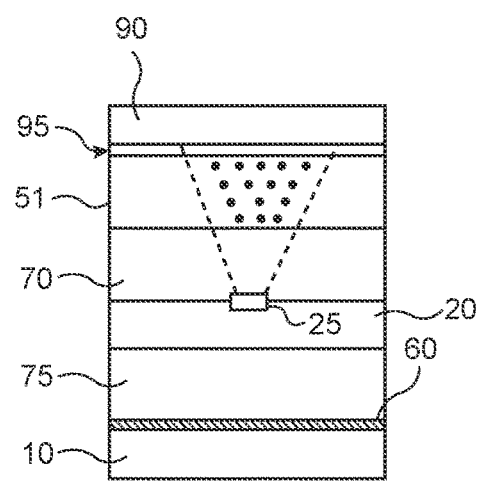

Partial FIGS. 10A and 10B show a further design form of a display and control element according to the proposed principle, in which a color filter 95 is also arranged above the unstructured diffuser layer 40 and the structured diffuser layer 51, respectively. The color filter 95 serves to manipulate the emission spectrum of light emitted by the optoelectronic components 25 arranged below the color layer 95. When these emit a very broadband emissive spectrum, the color filter 95 allows selection of a particular portion of the emissive spectrum. In addition, the color filter 95 can also be designed as an electrochromic filter 95 so that, on the one hand, the emission spectrum can be adjusted, and, on the other hand, the shape of the symbols can also be suitably adapted by the shadow mask 50. In FIG. 10A, the color filter 95 is arranged between the diffuser layer 40 and the shadow mask 50.

In FIG. 10B, the color filter 95 is applied to the structured diffuser layer 51. Although in this context the color filter 95 can also be implemented between the structured diffuser layer 51 and the adhesive layer 70, a spatial light intensity is lower due to the diffuser particles within the structured diffuser layer 51. This allows the color filter 95 in the form shown in FIG. 10B to be somewhat thinner than would be the case, for example, with a color filter between the diffuser layer and the adhesive layer 70.

As in the previous embodiments, the tactile sensor 60 is applied to the carrier element 10, i.e. the carrier film. It is thus located behind the main radiation direction of the respective optoelectronic components.

Figure 11A:
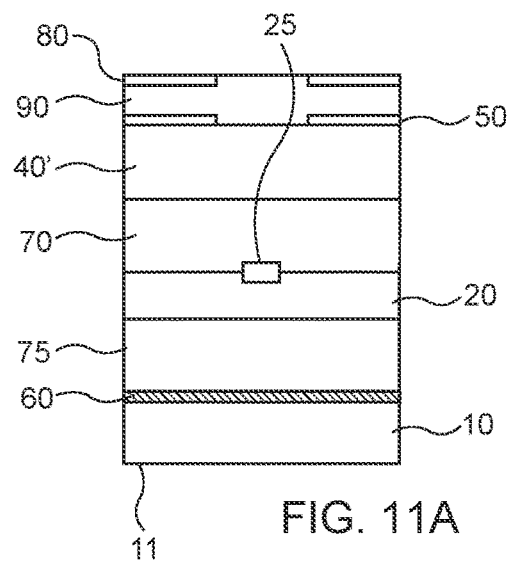
FIGS. 11A and 11B are illustrations of an 11th and 12th embodiment of a control element explaining some aspects of the proposed principle.
Figure 11B:
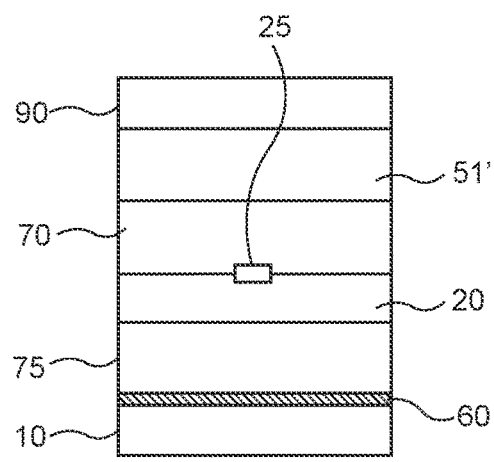

In partial FIGS. 11A and 11B, FIGS. 11A and 11B show two further designs of a display and control element in which the diffuser layer 40 is additionally formed with converter particles. In FIG. 11A, the converter particles are accommodated in the diffuser layer 40 and serve to convert the light of a first wavelength emitted by the optoelectronic components 25 into a second wavelength. In the embodiment example of FIG. 11A, the optoelectronic components 25 generate a blue light during operation, which is converted into yellow light by the converter particles in the diffuser layer 40'. The resulting mixed light has the color white and is mapped via the shadow mask 50 into a corresponding symbol for the viewer.

FIG. 11B shows a similar embodiment in which the diffuser layer 51' is both structured and filled with converter particles. Depending on the design, the converter particles are also distributed spatially inhomogeneously, so that light conversion takes place primarily in areas of the symbol to be displayed. In this way, it is possible to create a display and control element in which the symbol is generated by a differently colored structure. For example, the individual symbols can shine white, while the surrounding areas shine with the blue light emitted by the optoelectronic components. Alternatively, it is also possible for the display and control element to be lit in white in essence, with the symbols being displayed to a user by unconverted blue light.

Figure 12A:
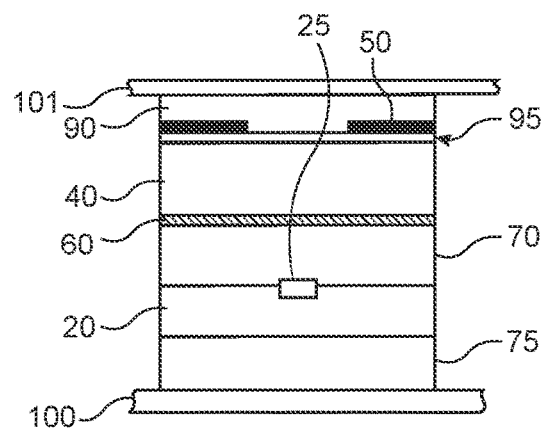
FIGS. 12A and 12B illustrate 13th and 14th embodiments of a control element having some aspects according to the proposed principle.
Figure 12B:
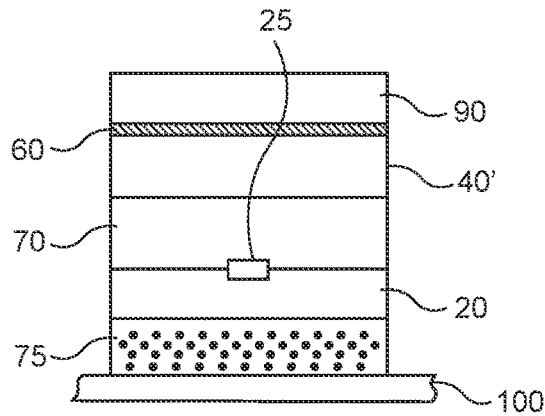

FIGS. 12A and 12B show a further embodiment in which the position of the touch-sensitive sensor 60 is adjustable with respect to a color filter layer 95 and a converter layer 40', respectively. The two sub-figures thus form combinations of features of the previous embodiments, in which the touch-sensitive sensor 60 is arranged at different positions within the display and control element.

FIG. 12A, the tactile sensor 60 is disposed between the adhesive layer 70 and the diffuser layer 40. The color filter 95 is disposed above the diffuser layer. In addition, a transparent glass layer 100 is provided in part-FIG. 12A, to which the display and control element with its adhesive layer 75 is applied. A further glass layer 101 lies over the cover film layer 90, so that the individual layers of the display and control element are embedded between the two glass layers.

In partial FIG. 12B, on the other hand, the sensitive sensor 60 is located downstream of the converter and diffuser layer 40' with respect to the main radiation direction, i.e., it is located between the converter layer 40' and a cover foil layer 90. Also in partial FIG. 12B, a glass layer 100 is provided on which the adhesive layer 75 with absorber particles for preventing light wave conduction is applied.

It should be mentioned at this point that the individual embodiments, in particular the various layers, can be combined in various ways. As shown in the preceding and the still following embodiment examples, the capacitively or resistively operating touch-sensitive sensor 60 can be provided at different positions within the display and control element. Moreover, the sensor 60 can be transparent so that, on the one hand, it does not obstruct the view of a user through the glass panes and, on the other hand, light from the opto-electronic components 25 can easily pass through the sensor.

FIGS. 13A, 13B, 14A and 14B show further embodiments in their respective partial figures A and B, wherein a haptic sensing element 110 is additionally provided. The haptic button element 110 has a different design and serves to provide a user with a haptic indication in addition to a visual indication. Thus, a user can also sense the display and control element by the haptic indication alone and activate the sensitive sensor by exerting a pressure or a key.

Figure 13A:
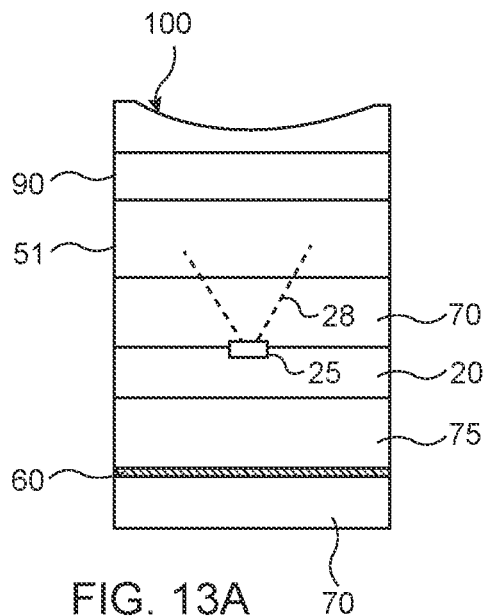
FIGS. 13A and 13B are illustrations of a 15th and 16th embodiment of a control element with some aspects according to the proposed principle.
Figure 13B:
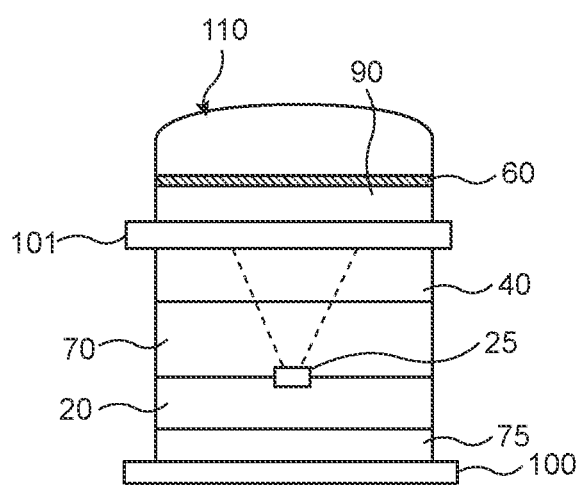

In FIG. 13A, the haptic button element 110 is applied directly to the cover film layer 90. Cover film layer 90 is in turn bonded to textured diffuser layer 51. In FIG. 13B, individual layers of the display and control element are arranged between two glass layers 100 and 101. Cover film layer 90 of the display and control element is applied to the side of the glass layer 101 facing away from the optoelectronic components 25. The tactile sensor 60 is arranged thereon. The haptic touch element 110 is located directly on the touch-sensitive sensor and is arranged in the immediate vicinity thereof. This embodiment is convenient because the display and control element can be manufactured separately as a separate display element with the two glass layers 100 and 101. In a subsequent step, the touch-sensitive sensor is then arranged together with the haptic touch element 100 and the cover film layer 90 to complete the display and control element on the cover-side glass layer 101.

Figure 14A:
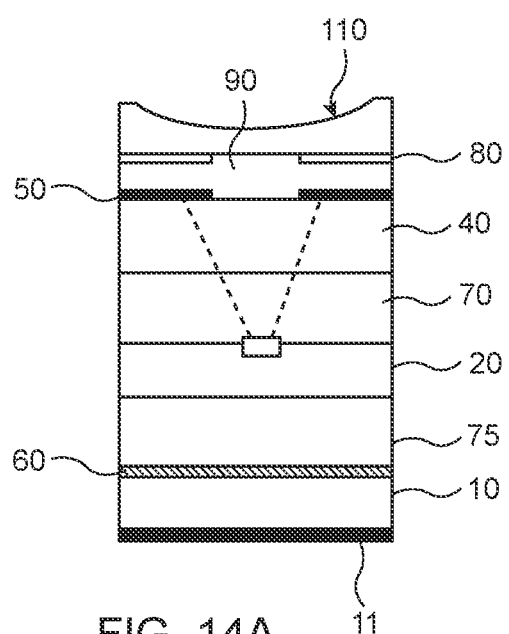
FIGS. 14A and 14B illustrate a 17th and 18th embodiment of a control element having some aspects according to the proposed principle.
Figure 14B:
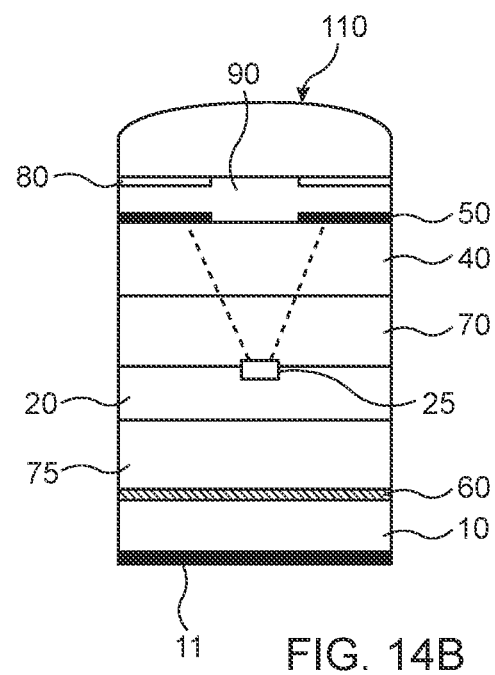

FIGS. 14A and 14B show another embodiment, this time with shadow mask 50. The two partial FIGS. 14A and 14B are constructed in a similar manner and correspond essentially to the embodiment of FIG. 1. Only two differently curved and shaped haptic touch elements 110 are applied to and attached to the upper side of the cover foil layer 90 and the color layer 80.

Figure 15A:
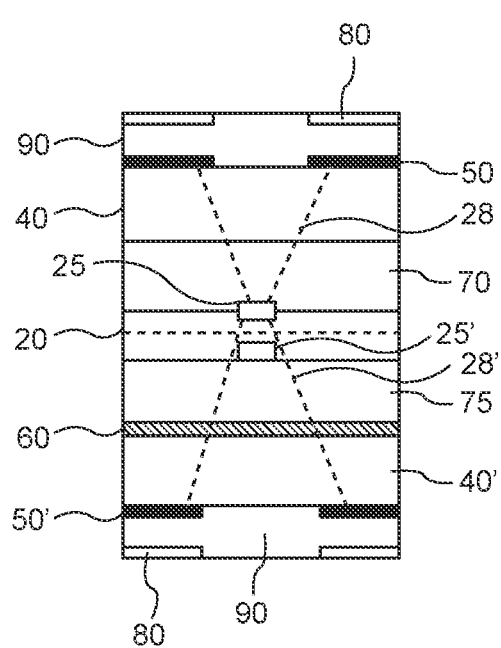
FIGS. 15A and 15B show embodiments of a control element with some aspects according to the proposed principle, in which the emission of light is in two opposite directions.
Figure 15B:
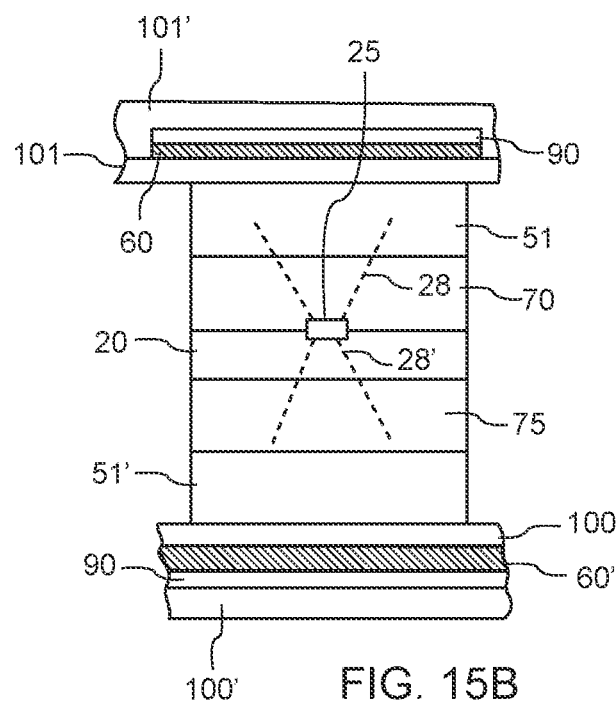

FIGS. 15A and 15B show in its partial figures A and B a further different concept of the proposed principle, in which the display and control element, in contrast to the preceding embodiment examples, has a further main radiation direction. This second main radiation direction 28' is opposite to the first main radiation direction 28.

In FIG. 15A, the optical display and control element with its individual layers has a substantially symmetrical structure, a central layer 20 being designed as a luminous foil with several optoelectronic components 25. Along the second main radiation direction 28', the adhesive layer 75 is provided, on which the sensitive sensor element 60 is arranged. Subsequently, a structured diffuser layer 40' is applied, to which a second shadow mask 50' adjoins. The shadow mask 50' is again covered by the cover foil layer 90 and a color layer 80 structured in the same way. The symbol of the second shadow mask 50' may differ from the symbol of the first shadow mask 50 along the first main radiation direction 28. However, it is also possible that both show the same symbol.

In one operation, the two optoelectronic components 25 and 25' generate light in the different main radiation direction 28 or 28'. By means of a suitable reflection layer or absorber particles within the luminous foil 20, a crosstalk of light from the upper area, i.e. along the first main radiation direction, which is reflected back into the second area can be avoided. Conversely, light emitted in the second main radiation direction 28' cannot reach the area of the first main radiation direction and the shadow mask 50 due to the absorber particles in the luminous foil 20. In this way, the optical display and control element can be implemented for a two-sided application, whereby the symbols on both sides of the application can be controlled differently.

FIG. 15B, another embodiment of such a principle is shown. In this one, several changes have been made compared to FIG. 15A. First, the shadow masks 50 and 50' are replaced by structured diffuser layers 51 and 51' as in the previous embodiments. At the same time, only one type of optoelectronic components 25 is provided, which are designed to emit light both in the first main emission direction 28 and in the second main emission direction 28' starting from the luminous foil 20. The optoelectronic components 25 thus generate light in both directions in one operation.

A first glass layer 101 is now applied to the diffuser layer 51'. A touch-sensitive sensor 60 with a subsequent transparent cover layer 90 is arranged on this glass layer. The touch-sensitive sensor and the cover layer 90 are encapsulated together by a further glass layer 101'. A similar structure is located on the second diffuser layer 51' with a glass layer 100, a touch-sensitive sensor 60' and a cover layer 90 arranged thereon. This touch-sensitive sensor 60' with its cover layer 90 is also surrounded by a further glass layer 100'. In one operation of this display and control element, a user can operate the element on both sides through the two existing touch-sensitive sensors.

The two touch-sensitive sensors, or their read-out and control electronics, are designed for this purpose in such a way that they can detect from which side a user touches or applies pressure to the optical display and control element. This can be determined, for example, by the different capacitance changes in the touch-sensitive sensors 60 and 60'. Thus, a capacitance change is likely to be greater in the sensor that is closer to the user's touch point. In this way, a control element can be embedded in a transparent surface, for example between two panes, and can be operated from both sides.

Figure 16A:
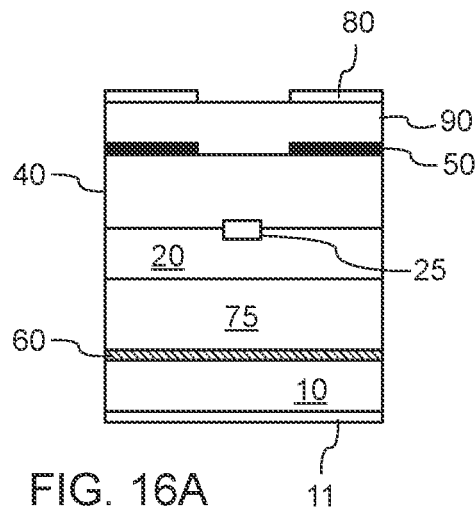
FIGS. 16A and 16B illustrate a 20th and 21st embodiment of a control element with some aspects according to the proposed principle.
Figure 16B:
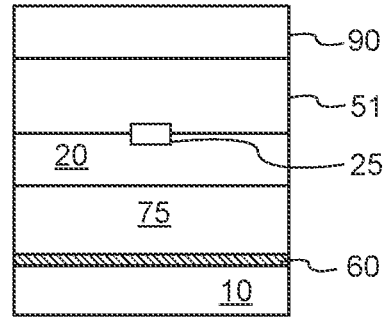

FIGS. 16A and 16B show a further embodiment in which the luminescent foil 20 with its optoelectronic components 25 is attached directly and immediately to the diffuser layer 40 or the structured diffuser layer 51. In FIG. 16A, the optoelectronic components are integrated in the luminous foil 20. The luminous foil 20 and the diffuser layer 40 are bonded together without another additional adhesive layer. The thickness of the diffuser layer 40 is selected so that the symbols of the shadow mask 50 can nevertheless be sufficiently homogeneously illuminated. In part-FIG. 16B, the diffuser layer 51 is structured and similarly bonded directly to the luminous foil 20 without an additional adhesive layer or only by a very thin adhesive layer. The adhesive layer 75 connects the luminous foil 20 to the touch-sensitive sensor 60 on the side facing away from the main radiation direction.

Figure 17:
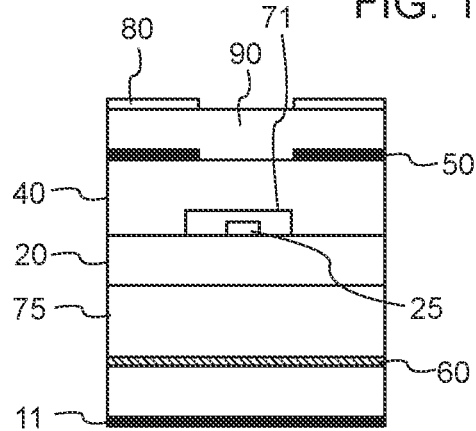
FIG. 17 shows another embodiment of a control element with some aspects according to the proposed principle.

FIG. 17 shows a further embodiment of the proposed principle. In this case, optoelectronic components 25 are arranged on the surface of the luminous foil 20. The diffuser layer 40 now comprises one or more recesses 71 and is placed in such a way that the component (s) 25 comes to lie approximately centrally in the recess 71. A separate recess may be provided for each component 25, or a common recess may be provided for a plurality of components. The recess 71 thus forms a cavity in the optical display and control element, so that the opto-electronic component 25 is surrounded by a medium which has a lower refractive index than the diffuser layer 40. As a result, back reflection can be reduced, and the radiation behavior can also be adjusted in a suitable manner in the direction of the shadow mask 50. In the embodiment example, the thickness of the diffuser layer 40 is selected in such a way that sufficient homogenization can be set via the symbol generated by the shadow mask 50.

Figure 18:
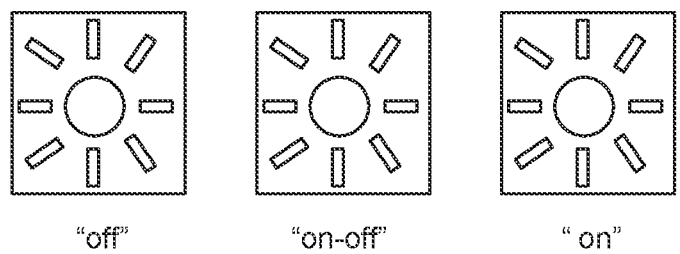
FIG. 18 shows an embodiment of a control element in different operating states to explain some aspects of the proposed principle.

FIG. 18 now shows a possible application of a display and control element according to the proposed principle. As explained in the previous examples, the display and control element comprise one or more possible optoelectronic components. In some embodiments, the optoelectronic components form a simple matrix structure in rows and columns, with homogenization and display of the symbol by a shadow mask as the symbol element. In other embodiments, the arrangement of the optoelectronic components is chosen to follow the shape or arrangement of the symbol to be displayed.

FIG. 18 shows an embodiment of a stylized sun as a possible display and control element. The display and control element can be switched between three states, which are designated as "off", "half-on" and "on". In the first state "off" the opto-electronic components are switched off and the symbol is essentially not visible or only visible through its structuring or the shadow mask. When the symbol is actuated or external parameters are changed, the state of the display and control element is switched from "off" to "half-on". In this state, it is possible, for example, to activate only half of the respective optoelectronic components in order to thus generate a low illumination.

For example, only the optoelectronic components that are assigned to the lower half of the displayed sun can be switched on. Alternatively, the components can be operated with less current, so that the intensity is lower. When the display and control element is operated or external parameters are changed further, the display and control element is switched from the "half-on" state to the "on" state. This activates all opto-electronic components equally and displays the symbol in its full form. Alternatively, the brightness of the symbol can be changed. The special arrangement of the optoelectronic components under a respective shape structure of the symbol together with the diffuser layer ensures uniform illumination of the symbol even at different light intensities.

Figure 19:
FIG. 19 is an embodiment of a control panel with some aspects according to the proposed principle.

FIG. 19 shows a control panel such as can be placed on a windshield or other transparent surface. The control panel shown here comprises several symbols that can be illuminated in different ways and also have different colors in the various states. From its left side, the control panel comprises a control element with a single icon, then a control element with an information display called "Passenger Airbag" with additionally two switchable icons for active on or off switching, and on the right side a control element with another icon. By pressing the individual icons, different functions of the control elements can be called up on a display or otherwise and, if necessary, shown.

Furthermore, it is possible to change the individual colors when the respective area of the control panel is actuated, or to adjust their intensity. In this way, a user is not only informed about which function he is currently executing, but also about the status of the respective control element and the function behind it. In this way, different display and control elements can be implemented on windshields, glass panes or other transparent surfaces. Different colors can be used for the optoelectronic components, so that the operation and status is indicated to the user not only by a simple "lights up" or "does not light up", but also by different colors. The flexible design using a carrier foil also makes it possible to apply the optical display and control elements to existing curved or straight surfaces. This increases flexibility, and the display and control elements can also be retrofitted.

Figure 20:
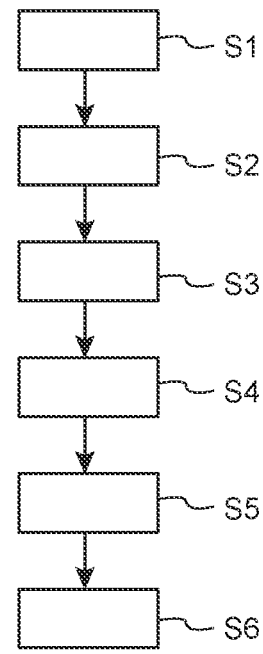
FIG. 20 is an illustration of an example of a method for manufacturing a control panel with some aspects of the proposed principle.

Finally, FIG. 20 shows in schematic form the various process steps for producing a display and control element according to the proposed principle. In step S1, a carrier element is provided. This can be, for example, a flexible carrier foil made of a transparent or non-transparent plastic. In some embodiments, this carrier foil is further filled with absorber particles to avoid light reflection and wave conduction within the control element. The carrier element can also be the glass pane itself, to which the further elements of the display and control element are applied at a later stage.

In a second step S2, a luminous foil is now provided, in which or on which at least two optoelectronic components and contact lines connected thereto are arranged. The components are designed to generate light of a first and possibly also of a further wavelength along a first main radiation direction. As explained in the previous examples, such a luminescent foil can already be prefabricated, whereby the optoelectronic components can be integrated both on the surface of the luminescent foil and in it. In the latter case, the luminous foil is formed by several sub-layers arranged on top of each other and enclosing the optoelectronic components on both sides.

In step S3, the luminous foil is applied to the carrier element and fixed to it. For this purpose, a suitable adhesive layer can be used, which is arranged between the carrier element and the luminescent foil. However, it is also possible to apply the luminous foil directly to the carrier element without a further adhesive layer and to attach it to the carrier element by means of pressure and heat, among other things.

Subsequently, a diffuser layer is arranged on the luminescent foil in step S4, so that the light emitted by the opto-electronic components reaches the diffuser layer. The diffuser layer is arranged on the luminescent foil in such a way that sufficient homogenization of the emitted light is achieved. For this purpose, for example, an additional adhesive layer can be provided between the diffuser layer and the luminous foil, the thickness of which can be adjusted in a suitable manner. A possible distance between adjacent opto-electronic components, the pixel pitch, thereby creates a dependence of the thickness of the corresponding adhesive layer or the distance between the optoelectronic components and the light emission side of the diffuser layer. The thickness of the diffuser layer and the thickness of the adhesive layer are selected in such a way that the light emitted by the opto-electronic components overlaps and sufficient homogenization is achieved when the light enters the diffuser layer, but at the latest when it leaves the diffuser layer, to give the user the impression of a uniform and homogeneous light distribution.

In step S5, a structured symbol element is now provided, which is not arranged in front of the diffuser layer with respect to the main radiation direction. The symbol element is designed to display at least one symbol during operation of at least one of the at least two optoelectronic components and during a top view of a user onto the diffuser layer along the first main radiation direction. The structured symbol element can thus image one or more symbols, lines or letters.

In a final step S6, a touch-sensitive sensor is provided. This is designed to detect and record an applied touch or pressure either along the first main radiation direction or in the opposite direction and to generate an electrical signal from this. Depending on the embodiment, the touch-sensitive sensor is arranged between the diffuser layer and the luminescent foil or also behind the luminescent foil, i.e. outside the first main radiation direction.

In some further embodiments, an additional cover layer can optionally be provided, which on the one hand protects the diffuser layer from possible damage and on the other hand adjusts the refractive index. The additional cover layer can also be provided with haptic touch elements.

Figure 21:
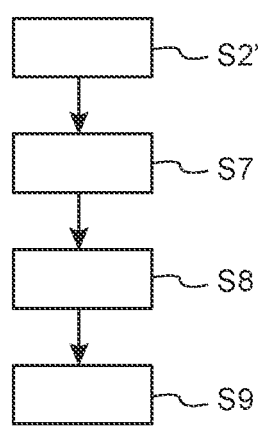
FIG. 21 shows another example of a method for explaining some aspects.

FIG. 21 shows a further embodiment and supplement to the process in which, in step S2', a luminous foil with opto-electronic components is provided which have two mutually opposite main emission directions. This makes it possible that in one operation the opto-electronic components emit light away from each other on both sides, which makes it possible to display in different directions. In such a case, the method further comprises step S7, in which a second diffuser layer is applied in such a way that it is arranged downstream of the at least two optoelectronic components with respect to the second main emission direction. Depending on the form of embodiment, the second diffuser layer is either structured itself, so that it forms a second structured symbol element due to a spatial inhomogeneous distribution of diffuser or absorber particles.

Alternatively, as shown in step S8, a second structured symbol element can also be arranged on the second diffuser layer, wherein the second structured symbol element is not located in front of the second diffuser layer with respect to the second main radiation direction. In an operation of at least one of the at least two optoelectronic components and in a top view of the second diffuser layer along the second main radiation direction, the structured second symbol element visualizes a corresponding symbol to a user.

In step S9, a second touch-sensitive sensor is further arranged, which is adapted to detect an applied touch or pressure along the second main radiation direction and to generate an electrical signal therefrom. In this way, an optical display and control element is created which can be operated in the same way from both sides. The symbols generated by the first and second symbol elements can be different for a user. Likewise, a suitable absorber or reflective layer prevents light from one side from reaching the other side.

By means of suitable electrochromic color layers or other measures, the symbols can also be designed differently so that the symbols can be changed depending on the state of the display and control element. This allows great flexibility in use, not only for double-sided display and control elements, but also for single-sided display and control elements and creates various display options on transparent surfaces.

REFERENCE LIST 1 control element
2 carrier element, carrier film
11 color layer
luminous foil
optoelectronic component
26, 26' contact leads
27, 27' connection, contact pad
28 first main radiation direction
28' second main radiation direction
diffuser layer
40' 51' diffuser layer with color converter
50, 51 structured symbol element
60 touch-sensitive sensor
70 adhesive layer
71 medium
75 adhesive layer
80 color layer
90 cover film layer
95 color filter
100, 101 glass layer
110 haptic touch element
270 insulating layer

The invention claimed is:
1. A control element comprising:
a carrier element;
a luminous foil in which or on which at least two optoelectronic components for generating light along a first main radiation direction as well as contact lines connected thereto are arranged;
a diffuser layer arranged downstream of the at least two optoelectronic components with respect to the first main radiation direction;
a structured symbol element which is not arranged in front of the diffuser layer with respect to the first main radiation direction and is designed to form at least one symbol when the at least two optoelectronic components are operated and in a top view of the diffuser layer when viewed along the first main radiation direction;
a tactile sensor adapted to detect contact or pressure exerted along or opposite to the first main radiation direction and to generate an electrical signal therefrom; and
at least one of the following layers:

an adhesive layer disposed between a support element and the luminous foil; or
a cover foil layer arranged downstream of the diffuser layer with respect to the first main radiation direction,
wherein a distance between the diffuser layer and the at least two optoelectronic components depend on a distance between the at least two optoelectronic components.

2. The control element according to claim 1, in which the structured symbol element is formed by a shadow mask arranged on the diffuser layer with respect to the first main radiation direction, and the distance between the diffuser layer and the at least two optoelectronic components is greater than half the distance between the at least two optoelectronic components.

3. The control element according to claim 1, wherein the structured symbol element is formed by the diffuser layer.

4. The control element according to claim 3, wherein the distance between the diffuser layer and two adjacently arranged optoelectronic components, which are assigned to the same symbol, is less than half the distance between the two adjacent optoelectronic components and/or wherein the distance between the diffuser layer and two adjacently arranged optoelectronic components, which are assigned to different symbols, is less than half the distance between the two adjacent optoelectronic components.

5. The control element according to claim 1, further comprising:
an adhesive layer that bonds the luminous foil to the diffuser layer, and whose thickness substantially creates the distance between the diffuser layer and the at least two optoelectronic components.

6. The control element according to claim 1, in which a reflective or absorbent element, in particular an absorbent color layer, is provided on the carrier element or the luminous foil on a side facing away from the first main radiation direction.

7. The control element according to claim 1, in which an element, in particular the carrier element or the luminous foil, arranged on a side facing away from the first main radiation direction, is formed with absorber particles.

8. The control element according to claim 1, in which the structured symbol element is formed by a shadow mask arranged on the diffuser layer.

9. The control element according to claim 1, in which the structured symbol element is formed by a structuring in the diffuser layer, in particular by a spatial distribution of diffuser particles in the diffuser layer forming the structuring.

10. The control element according to claim 1, in which the diffuser layer comprises an electrochromic layer.

11. The control element according to claim 1, further comprising:
an optionally partially transparent colored layer, which is arranged downstream of the diffuser layer with respect to the main radiation direction, the colored layer optionally being structured and, in particular, being structured similarly to the structured symbol element.

12. The control element according to claim 1, in which the diffuser layer comprises converter particles for converting irradiated light of a first wavelength into light of a second wavelength.

13. The control element according to claim 1, further comprising:

a color filter arranged downstream of the diffuser layer with respect to the main radiation direction, wherein the color filter is in particular unstructured.

14. The control element according to claim 1, in which the carrier element comprises a glass layer and/or a carrier film which is applied to a glass layer.

15. The control element according to claim 1, wherein the tactile sensor is arranged between the luminous foil and the diffuser layer; or wherein the tactile sensor is arranged after the diffuser layer with respect to the first main radiation direction; or in which the tactile sensor is arranged between the carrier element and the luminous foil.

16. The control element according to claim 1, in which the tactile sensor is a capacitive sensor whose extent optionally corresponds at least to an extent of the structured symbol element.

17. The control element according to claim 1, in which the at least two optoelectronic components are designed as horizontal light-emitting diodes within each case two contact pads on the same side, which are connected to connections of the contact lines; or in which the at least two optoelectronic components are designed as vertical light-emitting diodes, one of the contact lines in each case being guided along an insulated side of the optoelectronic components onto a contact pad which is located on a light emission side of the optoelectronic component.

18. The control element according to claim 1, in which the two optoelectronic components are surrounded in the main radiation direction by a transparent material which comprises a refractive index which is lower than a material of the diffuser layer or an adhesive layer covering the transparent material.

19. The control element according to claim 1, wherein the two optoelectronic components are arranged to follow a shape of the structured symbol element.

20. The control element according to claim 1, further comprising:
a second main radiation direction oriented substantially opposite to the first main radiation direction;
a second diffuser layer arranged downstream of the at least two optoelectronic components with respect to the second main radiation direction; and
a structured second symbol element which is not arranged in front of the second diffuser layer with respect to the second main radiation direction and is designed to display at least one symbol during operation of at least one of the at least two optoelectronic components and a top view of the second diffuser layer along the main radiation direction.

21. The control element according to claim 20, wherein the structured second symbol element is formed by a second shadow mask arranged on the second diffuser layer with respect to the second main radiation direction, and the distance between the second diffuser layer and the at least two optoelectronic components is greater than half the distance between the at least two optoelectronic components; or
the structured second symbol element is formed by the diffuser layer.

22. The control element according to claim 20, wherein the tactile sensor is a first tactile sensor, and the control element further comprises a second tactile sensor adapted to detect a touch or pressure exerted along the second main radiation direction and to generate an electrical signal therefrom.

23. The control element according to claim 22, in which the first and second tactile sensors are arranged between two carrier elements and successively with respect to the main radiation direction of the respective diffuser layer.

24. The control element according to claim 1, further comprising:
a haptic touch element, which is arranged downstream of the respective diffuser layer with respect to the first and/or second main radiation direction and optionally applied to a carrier foil or a glass layer which is arranged downstream of the respective diffuser layer with respect to the first and/or second main radiation direction.

25. A method for producing a control element comprising the steps:
providing a support element;
providing a light-emitting foil in or on which at least two optoelectronic components as well as contact lines connected thereto are arranged, and the at least two optoelectronic components are designed in an operation for generating light along a first main radiation direction,
arranging the light-emitting foil on the support element;
arranging a diffuser layer on the light-emitting foil such that light emitted by the at least two optoelectronic components in an operation along the first main radiation direction radiates through the diffuser layer, wherein a distance between the diffuser layer and the at least two optoelectronic components depend on a distance between the at least two optoelectronic components;
arranging a structured symbol element with respect to the first main radiation direction not in front of the diffuser layer, which is designed to form at least one symbol when the at least two optoelectronic components are operated, and a top view of the diffuser layer is taken along the first main radiation direction; and
arranging a touch-sensitive sensor adapted to detect a contact or pressure exerted along or opposite to the first main radiation direction and to generate an electrical signal therefrom.

* * * * *